US012593620B2

(12) United States Patent
Patra et al.

(10) Patent No.: US 12,593,620 B2
(45) Date of Patent: Mar. 31, 2026

(54) TECHNOLOGIES FOR SCALABLE SPIN QUBIT READOUT

(71) Applicant: Intel Corporation, Santa Clara, CA (US)

(72) Inventors: Bishnu Prasad Patra, Zoetermeer (NL); Stefano Pellerano, Beaverton, OR (US); JongSeok Park, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 870 days.

(21) Appl. No.: 17/695,584

(22) Filed: Mar. 15, 2022

(65) Prior Publication Data

US 2023/0320237 A1      Oct. 5, 2023

(51) Int. Cl.
| | |
|---|---|
| *H10N 69/00* | (2023.01) |
| *H03H 11/28* | (2006.01) |
| *H10N 60/01* | (2023.01) |
| *H10N 60/10* | (2023.01) |

(52) U.S. Cl.
CPC ............. *H10N 69/00* (2023.02); *H03H 11/28* (2013.01); *H10N 60/01* (2023.02); *H10N 60/11* (2023.02); *H10N 60/128* (2023.02)

(58) Field of Classification Search
None
See application file for complete search history.

(56) References Cited

U.S. PATENT DOCUMENTS

| | | | |
|---|---|---|---|
| 4,837,609 | A | 6/1989 | Gurvitch et al. |
| 2014/0139221 | A1 | 5/2014 | Schwilch et al. |
| 2016/0211824 | A1 | 7/2016 | Kando et al. |
| 2017/0033815 | A1 | 2/2017 | Leipold et al. |
| 2019/0165172 | A1 | 5/2019 | Joshi et al. |
| 2020/0373890 | A1 | 11/2020 | Tokuda |
| 2022/0115577 | A1 | 4/2022 | Beck et al. |

FOREIGN PATENT DOCUMENTS

| | | |
|---|---|---|
| WO | 2021005208 A1 | 1/2021 |

OTHER PUBLICATIONS

EPO European Extended Search Report in EP Application Serial No. 22202006.7 mailed on Apr. 18, 2023, 10 pages.
Han Tianyi et al: "Radio-frequency measurement in semiconductor quantum computation," Science China Physics, Mechanics, vol. 60, No. 5, Mar. 21, 2017 (Mar. 21, 2017) , XP093037413, Beijing ISSN: 1674-7348, DOI: 10.1007/sl1433-017-9019-9 Retrieved from the Internet: URL:http://link.springer.com/article/10.10 07/sl1433-017-9019-9/fulltext.html>; 13 pages.

(Continued)

*Primary Examiner* — Matthew L Reames
(74) *Attorney, Agent, or Firm* — Alliance IP, LLC

(57) ABSTRACT

Technologies for scalable spin qubit readout are disclosed. In the illustrative embodiment, superconducting and semi-conducting components are integrated onto a single chip, allowing for frequency and temporal multiplexing components to be integrated onto the same die. The semiconducting components on the die can include transistors, varactors, and amplifiers, and the superconducting components can include an inductor and a capacitor that form part of an impedance matching network.

18 Claims, 16 Drawing Sheets

(56)        References Cited

OTHER PUBLICATIONS

Schupp F Jet al: "Radio-frequency reflectometry of a quantum dot using an ultra-low-noise Squid amplifier," arxiv.org, Cornell University Library, 201 Olin Library Cornell University Ithaca, NY 14853, Jun. 29, 2020 (Jun. 29, 2020), XP081678243, DOI: 10.1063/5.0005886; 10 pages.

Crippa, A. et al.; "Gate-reflectometry dispersive readout and coherent control of a spin qubit in silicon;" Nature Communications; (2019) 10:2776; https://doi.org/10.1038/s41467-019-10848-z | www.nature.com/naturecommunications; 6 pages.

Intel Corporation, "Technologies for Impedance Matching Networks for Qubits," U.S. Appl. No. 17/528,453, filed Nov. 17, 2021.

Keith, D., et al., "Single-Shot Spin Readout in Semiconductors Near the Shot-Noise Sensitivity Limit;" Physical Review; 041003; 2019; American Physical Society; 11 pages.

Küng, Bruno, "RF Reflectometry Measurements of Quantum Dots;" Zurich Instruments; Feb. 20, 2017; Accessed Feb. 27, 2022; https://www.zhinst.com/others/en/blogs/rf-reflectometry-measurements-quantum-dots.

Ruffino, A., et al., "Integrated multiplexed microwave readout of silicon quantum dots in a cryogenic CMOS chip," Jan. 20, 2021; Advanced Quantum Architecture Laboratory, Ecole Polytechnique Federale de Lausanne; 14 pages.

Schaal, Simon, et al., "A CMOS dynamic random access architecture for radio-frequency readout of quantum devices," Nature Electronics; vol. 2, pp. 236-242; Jun. 2019; 7 pages.

Sell, B., et al., "22FFL: A high Performance and Ultra Low Power FinFET Technology for Mobile and RF Applications," Intel Corporation, Hillsboro, OR; accessed Jan. 21, 2022; 4 pages.

Wikipedia, "Equivalent impedance transforms;" Last updated Sep. 16, 2019; Accessed Feb. 17, 2022; https://en.wikipedia.org/wiki/Equivalent_impedance_transforms.

Wikipedia, "Impedance matching;" Last updated Feb. 7, 2022; Accessed Feb. 17, 2022; https://en.wikipedia.org/wiki/Impedance_matching.

Wikipedia, "Phase-shift keying;" Jan. 17, 2022; Accessed Feb. 17, 2022; https://en.wikipedia.org/wiki/Phase-shift_keying.

USPTO Office Action received in U.S. Appl. No. 17/528,453, dated Apr. 21, 2025, 12 pages.

200

800

802 — FABRICATE SEMICONDUCTOR COMPONENTS

804 — APPLY DIELECTRIC LAYER OVER SEMICONDUCTOR LAYER

806 — FORM VIAS TO SEMICONDUCTOR LAYER

808 — FABRICATE SUPERCONDUCTING COMPONENTS ON DIELECTRIC LAYER

900

902

1300

| PROCESSOR UNIT 1302 | COMMUNICATION COMPONENT 1312 |

| MEMORY 1304 | BATTERY/POWER 1314 |

| DISPLAY DEVICE 1306 | GNSS DEVICE 1318 |

| AUDIO OUTPUT DEVICE 1308 | AUDIO INPUT DEVICE 1324 |

| AN OTHER OUTPUT DEVICE 1310 | AN OTHER INPUT DEVICE 1320 |

ANTENNA 1322

TECHNOLOGIES FOR SCALABLE SPIN QUBIT READOUT

BACKGROUND

Quantum computers promise computational abilities not feasible with classical computing. One of many challenges in quantum computing is high-fidelity measurement of quantum bits (qubits). For spin qubits, radio frequency (RF) reflectometry can be used to read a spin qubit state. An RF signal can be sent to a circuit whose resistance is coupled to the state of the qubit. The reflected signal can be used to sense the state of the qubit.

DETAILED DESCRIPTION

Figure 1A:
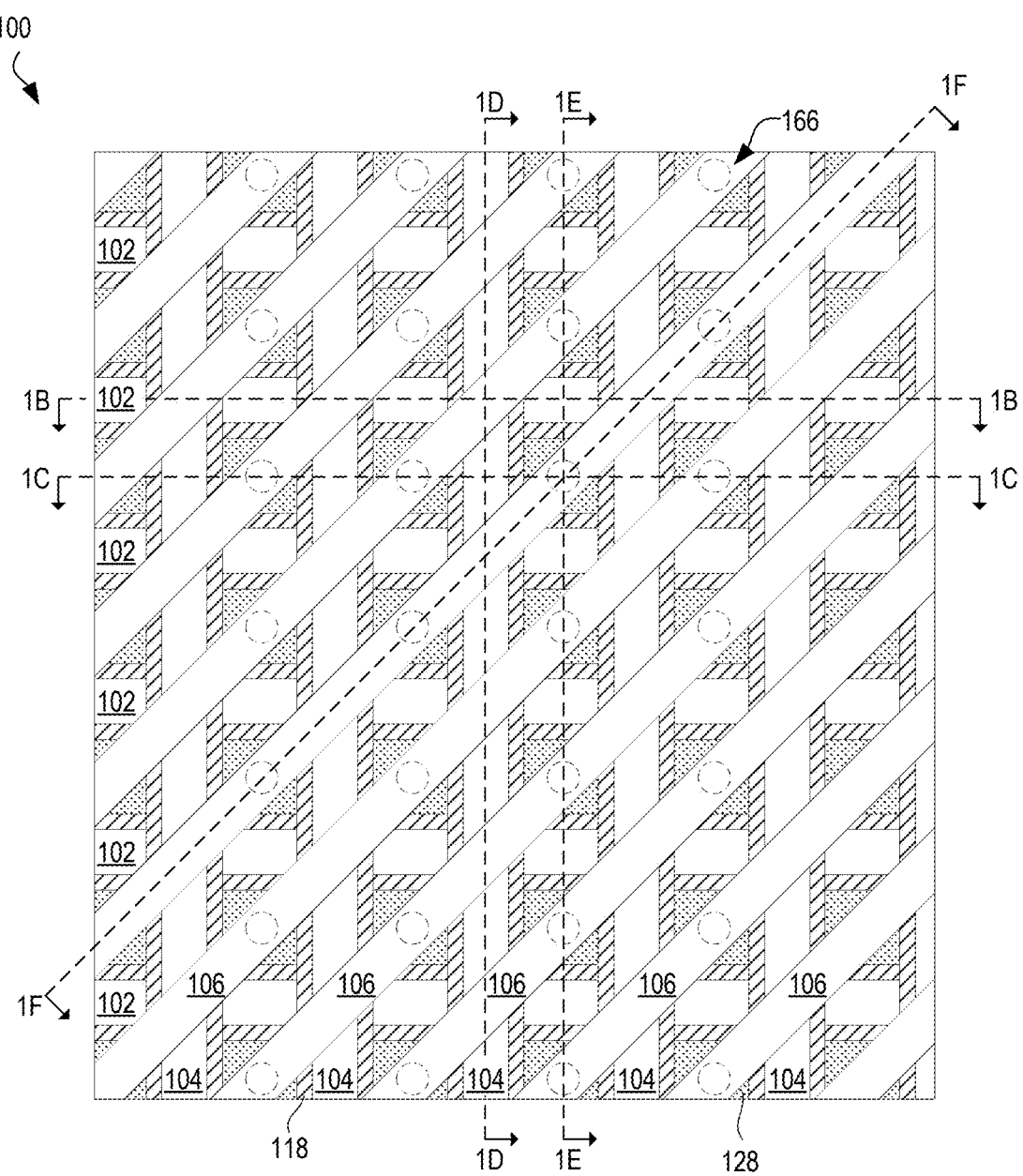
FIGS. 1A-1F illustrate various views of an example quantum dot device, in accordance with one embodiment.

Aspects of the present disclosure may include a temporal- and frequency-multiplexing circuit on a die (or chip) with an impedance matching network coupled to a spin qubit in a semiconductor. In the illustrative embodiment, the die includes both semiconducting and superconducting materials, allowing for selection of a qubit as well as an impedance matching network with a high Q-factor on one die.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

References are made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

A quantum computer uses quantum-mechanical phenomena such as superposition and entanglement to perform computations, simulations, or other functions. In contrast to digital computers, which store data in one of two definite states (0 or 1), quantum computation uses quantum bits (qubits), which can be in superpositions of states. Qubits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin." Qubits in quantum mechanical systems can be in a superposition of both states at the same time, a trait that is unique and fundamental to quantum computing.

Quantum computing systems execute algorithms containing quantum logic operations performed on qubits. In some cases, the result of the algorithm is not deterministic. The quantum algorithm may be repeated many times in order to determine a statistical distribution of results or in order to have a high likelihood of finding the correct answer. In some cases, a classical algorithm may be used to check if the quantum computer determined the correct result.

Qubits have been implemented using a variety of different technologies which are capable of manipulating and reading quantum states. These include but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer, including, but not limited to, those listed above. The particular physical implementation used for qubits is not necessarily required for the embodiments of the invention described herein.

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figures 1B, 1C:
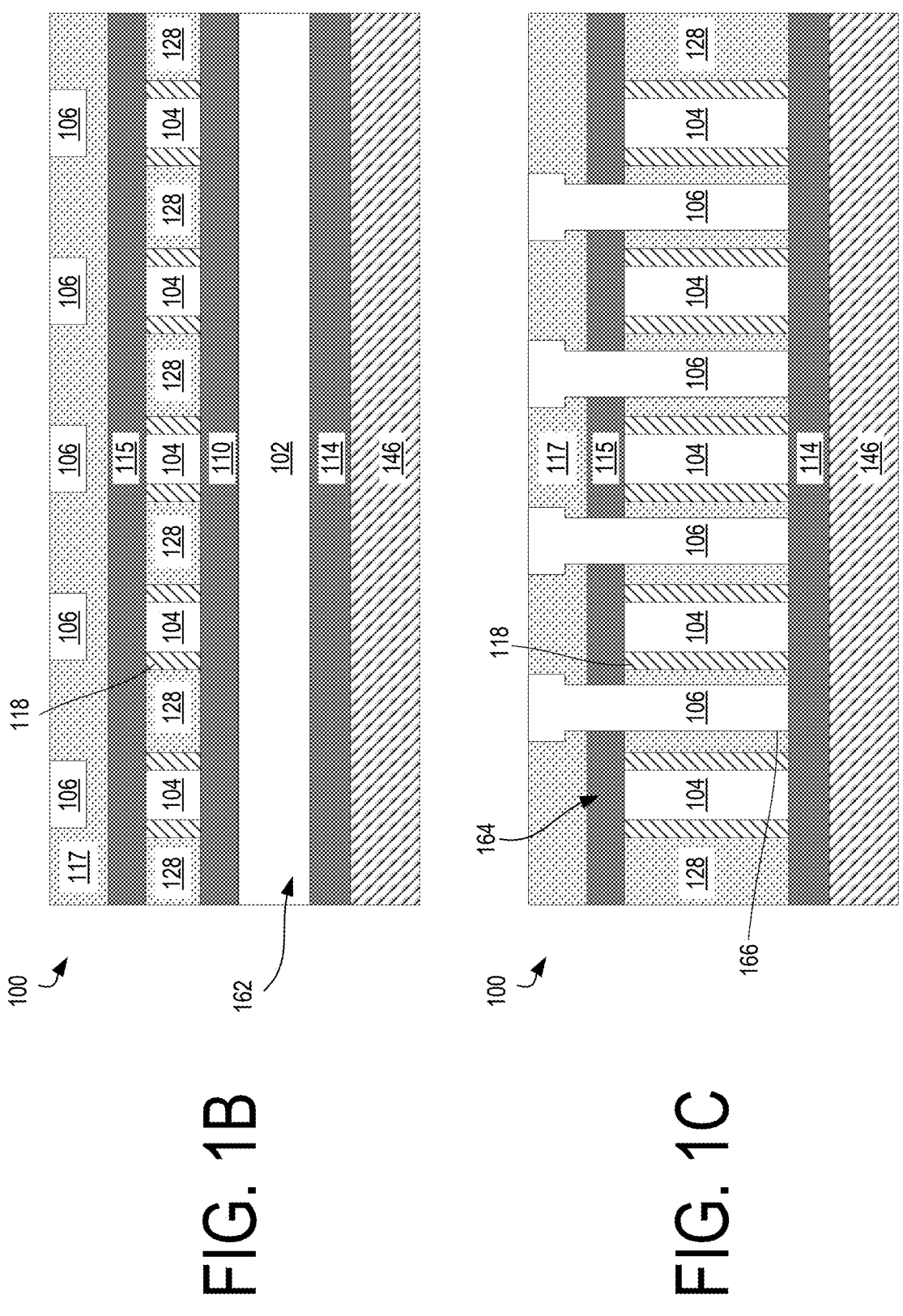
Figures 1D, 1E:
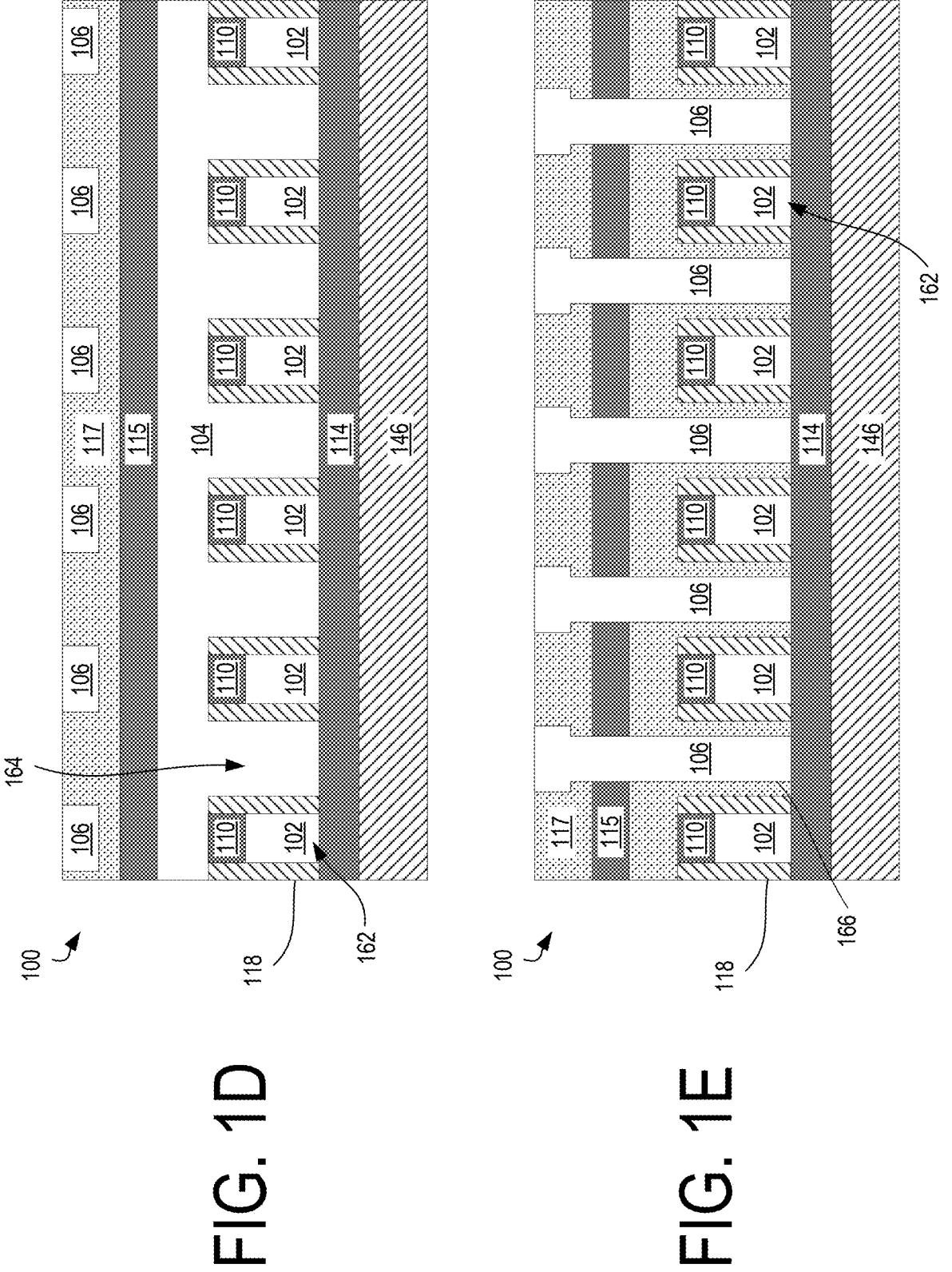
Figure 1F:
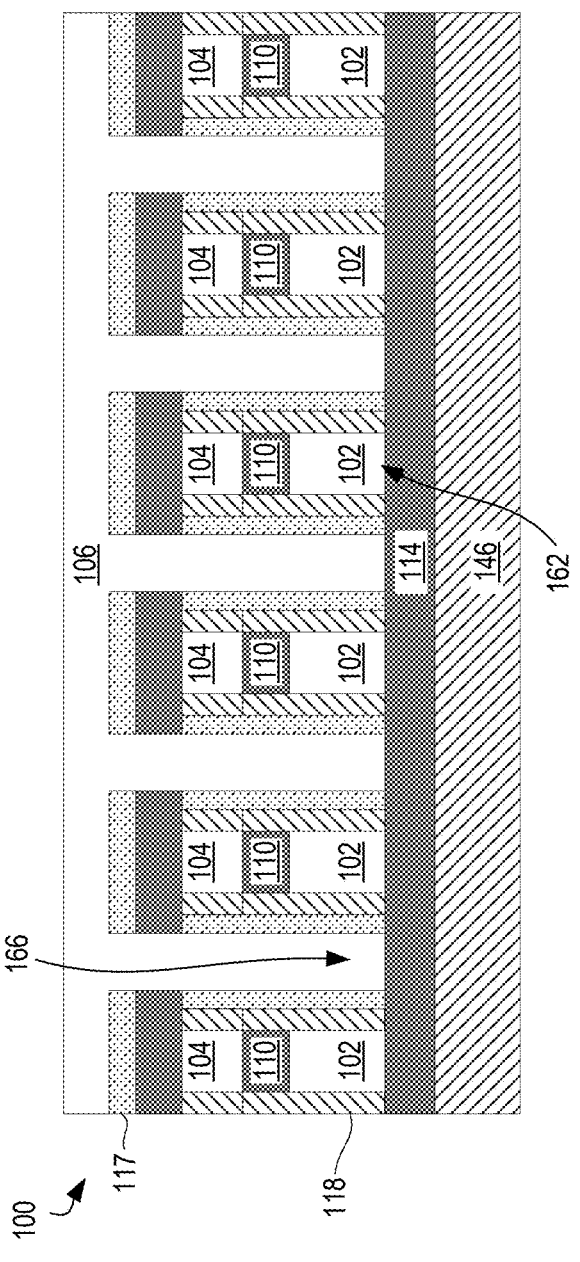

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Figure 2:
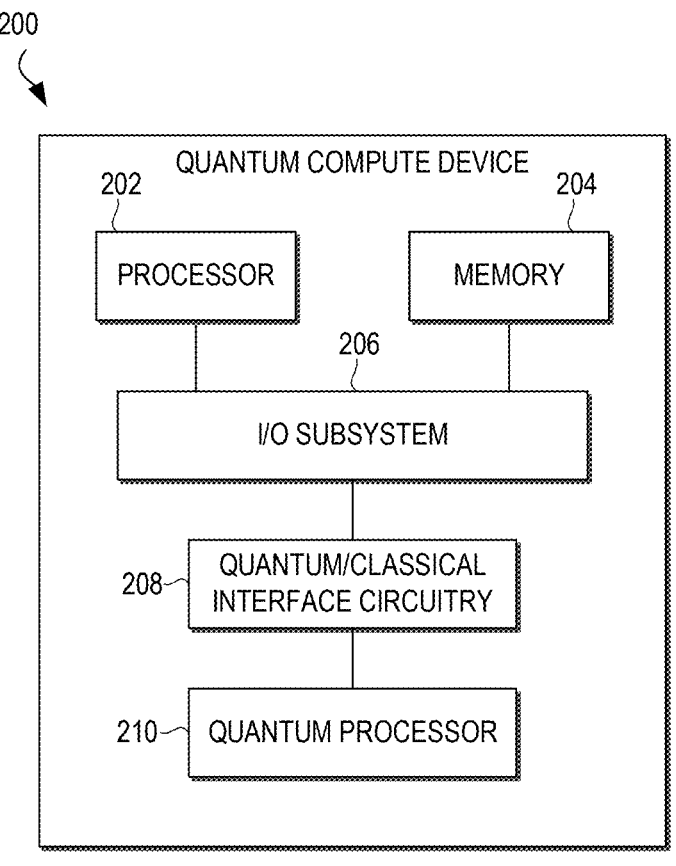
FIG. 2 is a simplified block diagram of at least one embodiment of a quantum compute device.

Referring now to FIG. 2, a simplified block diagram of a quantum compute device 200 is shown. In some embodiments, the quantum compute device 200 may include the quantum dot devices 100 described above in regard to FIGS. 1A-1F. The quantum compute device 200 may be embodied as or included in any type of compute device. For example, the quantum compute device 200 may include or otherwise be included in, without limitation, a server computer, an embedded computing system, a System-on-a-Chip (SoC), a multiprocessor system, a processor-based system, a consumer electronic device, a desktop computer, a laptop computer, a network device, a networked computer, a distributed computing system, and/or any other computing device. The illustrative quantum compute device 200 includes a processor 202, a memory 204, an input/output (I/O) subsystem 206, a quantum/classical interface circuitry 208, and a quantum processor 210. In some embodiments, one or more of the illustrative components of the quantum compute device 200 may be incorporated in, or otherwise form a portion of, another component. For example, the memory 204, or portions thereof, may be incorporated in the processor 202 in some embodiments. In some embodiments, the quantum compute device 200 may be embodied as the electrical device 1300 described below in regard to FIG. 13 or may include any suitable component of the electrical device 1300.

In some embodiments, the quantum compute device 200 may be located in a data center with other compute devices, such as an enterprise data center (e.g., a data center owned and operated by a company and typically located on company premises), managed services data center (e.g., a data center managed by a third party on behalf of a company), a colocated data center (e.g., a data center in which data center infrastructure is provided by the data center host and a company provides and manages their own data center components (servers, etc.)), cloud data center (e.g., a data center operated by a cloud services provider that host companies applications and data), and an edge data center (e.g., a data center, typically having a smaller footprint than other data center types, located close to the geographic area that it serves), a micro data center, etc. In some embodiments, the quantum compute device 200 may receive jobs over a network (such as the Internet) to perform on the quantum processor 210. The quantum compute device 200 may perform the jobs on the quantum processor 210 and send the results back to the requesting device.

The processor 202 may be embodied as any type of processor capable of performing the functions described herein. For example, the processor 202 may be embodied as a single or multi-core processor(s), a single or multi-socket processor, a digital signal processor, a graphics processor, a neural network compute engine, an image processor, a microcontroller, or other processor or processing/controlling circuit. The processor 202 may include multiple processor cores. In some embodiments, the processor 202 supports quantum extensions to an existing ISA of the processor/core 202, allowing instructions that interface with the quantum/classical interface circuitry 208 and the quantum processor 210.

The memory 204 may be embodied as any type of volatile or non-volatile memory or data storage capable of performing the functions described herein. In operation, the memory 204 may store various data and software used during operation of the quantum compute device 200, such as operating systems, applications, programs, libraries, and drivers. The memory 204 is communicatively coupled to the processor 202 via the I/O subsystem 206, which may be embodied as circuitry and/or components to facilitate input/output operations with the processor 202, the memory 204, and other components of the quantum compute device 200. For example, the I/O subsystem 206 may be embodied as, or otherwise include, memory controller hubs, input/output control hubs, firmware devices, communication links (e.g., point-to-point links, bus links, wires, cables, light guides, printed circuit board traces, etc.) and/or other components and subsystems to facilitate the input/output operations. The I/O subsystem 206 may connect various internal and external components of the quantum compute device 200 to each other with use of any suitable connector, interconnect, bus, protocol, etc., such as an SoC fabric, PCIe®, USB2, USB3, USB4, NVMe®, Thunderbolt®, Compute Express Link (CXL), and/or the like. In some embodiments, the I/O subsystem 206 may form a portion of a system-on-a-chip (SoC) and be incorporated, along with the processor 202 and the memory 204 and other components of the quantum compute device 200 on a single integrated circuit chip.

The quantum/classical interface circuitry 208 is configured to interface with both classical components of the quantum compute device 200, such as the processor 202 and memory 204, as well as the quantum processor 210. The quantum/classical interface circuitry 208 may include a variety of analog or digital circuitry, such as analog-to-digital converters, digital-to-analog converters, high gain amplifiers, low noise amplifiers, cryogenic amplifiers, field-programmable gate arrays (FPGAs), classical processors, application-specific integrated circuits (ASICs), signal conditioning circuitry, etc. In some embodiments, some or all of the quantum/classical interface circuitry 208 may be inside of a refrigerator, such as a dilution refrigerator, a magnetic refrigerator, a helium-4 and/or helium-3 refrigerator, etc. Some or all of the components of the quantum/classical interface circuitry 208 may be at any suitable temperature, such as 10 millikelvin, 100 millikelvin, 4 Kelvin, 20 Kelvin, 77 Kelvin, room temperature or above, or anywhere in between.

The quantum processor 210 is configured to operate one or more qubits. The qubits may be any suitable type of qubit, such as a quantum dot spin qubit described above in regard to FIGS. 1A-1F. In other embodiments, the qubits may be, e.g., charge qubits, transmon qubits, microwave qubits, superconducting qubits, or any other suitable type of qubits. The quantum processor 210 may include any suitable number of physical or logical qubits, such as $1-10^6$. In the illustrative embodiment, some or all of the quantum processor 210 is in a refrigerator such as a dilution refrigerator. In particular, in the illustrative embodiment, the qubits are held at a temperature of about 10 millikelvin. In other embodiments, the qubits may be held at any suitable temperature, such as 1-100 millikelvin or higher, depending on the temperature sensitivity of the particular qubit in use.

The quantum processor 210 may be able to control the various qubits in various ways, such as by performing two-qubit gates, three-qubit gates, error correction operations, transferring a state from one type of qubit to another, measuring some, any or, all of the qubits, initializing some, any, or all of the qubits, etc.

The quantum compute device 200 may include additional components not shown in FIG. 2, such as one or more data storage devices, a network interface controller, one or more peripheral devices, etc.

Figure 3:
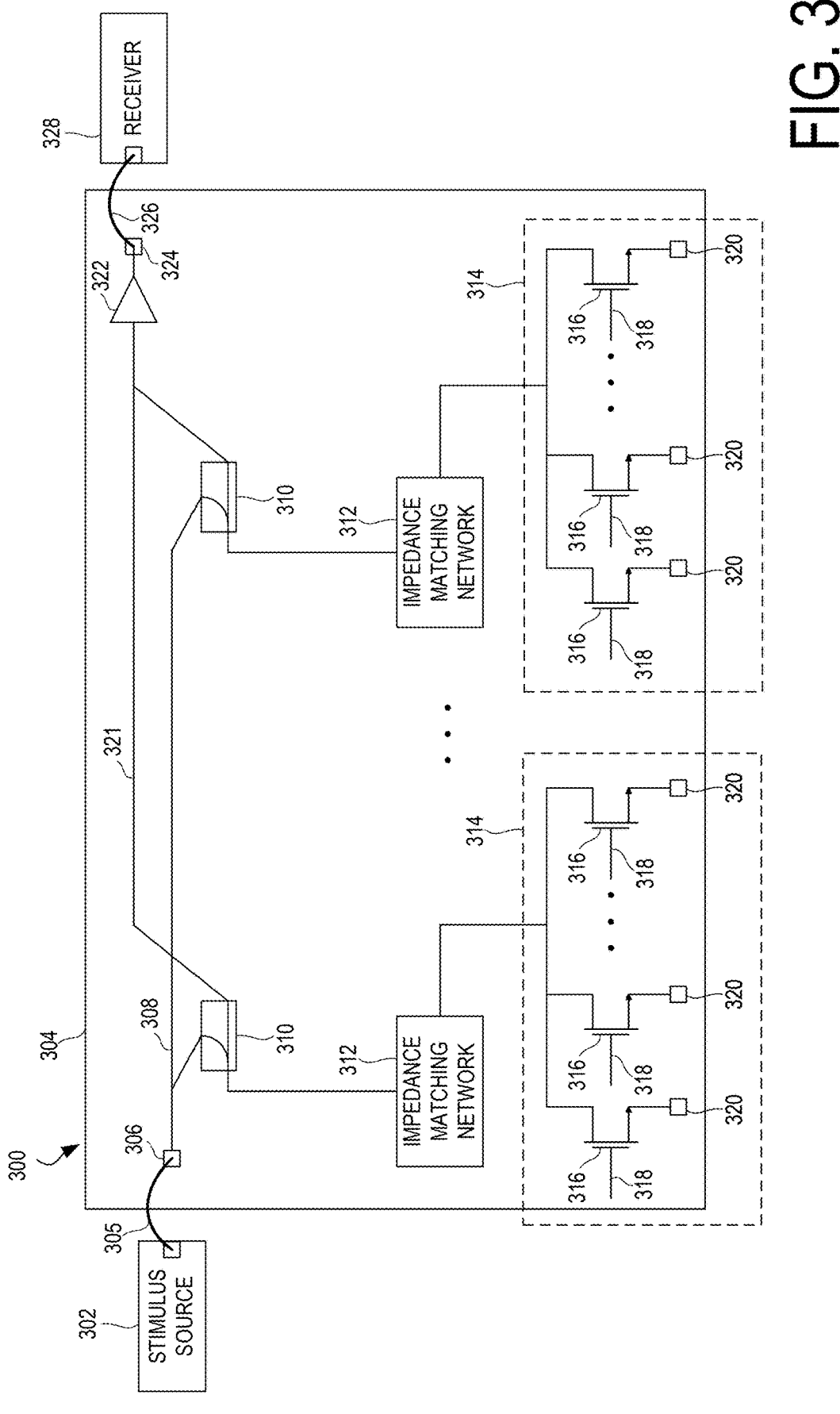
FIG. 3 illustrates an example system with a die for multiplexed qubit readout with one or more impedance matching networks.

Referring now to FIG. 3, in one embodiment, a system 300 includes a stimulus source 302 connected to a die 304. A wire 305 is wire bonded to a pad 306 on the chip 304. An input line 308 is connected to the pad 306 to carry signals from the stimulus source 302 to one or more couplers 310. Each coupler 310 acts as a coupler (e.g., a 50/50 coupler) at a particular frequency. One port of each coupler 310 is connected to an impedance matching network 312. The impedance matching network 312 is also coupled to a qubit selection circuit 314. The qubit selection circuit 314 includes several transistors 316 connecting the impedance matching network 312 to an output pad 320 on the die. In use, a qubit (not shown in FIG. 3) is connected to the output pad 320. Each transistor 316 is controlled by a signal on a trace 318 connected to the gate of the transistor 316. The qubit selection circuit 314 may include any suitable number of transistors 316 and may connect to any suitable number of qubits, such as 1-20 transistors 316 and qubits.

In use, the stimulus source 302 generates a radio-frequency (RF) signal at one or more frequency bands. In the illustrative embodiment, the stimulus source 302 generates a signal at each of several frequency bands corresponding to the frequencies at which the various couplers 310 operate, allowing the stimulus source 302 to probe several impedance matching networks 312 (and, therefore, several qubits) contemporaneously. The RF signal is sent over a line 308 to the couplers 310, which splits the RF signal matching the frequency of the coupler 310, sending it to the corresponding impedance matching network 312. The impedance matching network 312 matches the relatively low impedance of the stimulus source 302 and connecting lines to the relatively high impedance of the circuit interfacing with the qubits. One of the transistors 316 connected to each impedance matching network 312 is turned on, allowing for an interface with the qubit connected to the corresponding output pad 320. The impedance matching network 312 and the connection to the qubit are discussed in more detail below in regard to FIGS. 4-7.

Depending on the state of the selected qubit, some of the signal from the stimulus source 302 may be reflected off of the circuit coupled to the qubit, and some of the reflected signal will pass through the coupler 310 to an output 321 connected to an amplifier 322. An output of the amplifier is connected to a pad 324 on the die 304. A wire 326 is wire bonded to the pad 324 and connected to a receiver 328 to measure the reflected signal.

The stimulus source 302 may be any suitable RF source. The stimulus source 302 may create an RF pulse at any suitable wavelength, bandwidth, envelope (e.g., square or Gaussian), amplitude, etc. In the illustrative embodiment, the stimulus source 302 creates one or more pulses with a center frequency of 50-1,000 MHz and a bandwidth of 2-20 MHz. In the illustrative embodiment, the bandwidth of each pulse may be about 10 MHz. Each of the one or more pulses of the stimulus source 302 may be separated by any suitable bandwidth, such as 10-50 MHz. In the illustrative embodiment, there are 10 couplers 310, 10 impedance matching networks 312, and 10 qubit selection circuits 314, and the stimulus source 302 can generate 10 pulses spaced apart 50 MHz or more. In other embodiments, there may be any suitable number of couplers 310, impedance matching networks 312, and qubit selection circuits 314, such as any number from 1-100.

In the illustrative embodiment, each coupler 310 is a coupler 310 that splits the power of the incoming RF signal at the operating frequency of the coupler 310. At the operating frequency of each coupler 310, the coupler 310 has an impedance that matches other components on the same side of the impedance matching network 312, such as 50 Ohms. At other frequencies (and, in particular, at the operating frequencies of other couplers 310 in the system 300), each coupler 310 has a high impedance, reflecting any signals at those other frequencies.

It should be appreciated that the array of couplers 310, with each coupler only passing a particular frequency range and reflecting other frequencies, acts as a frequency multiplexing circuitry, splitting the multi-frequency signal from the stimulus source 302 into several different bands that are sent to several different impedance matching networks 312. It should also be appreciated that different frequency multiplexing circuitry may be used besides an array of such couplers 310, such as diplexers, triplexers, or other multiplexer filters combined with broadband couplers 310.

Figure 4:
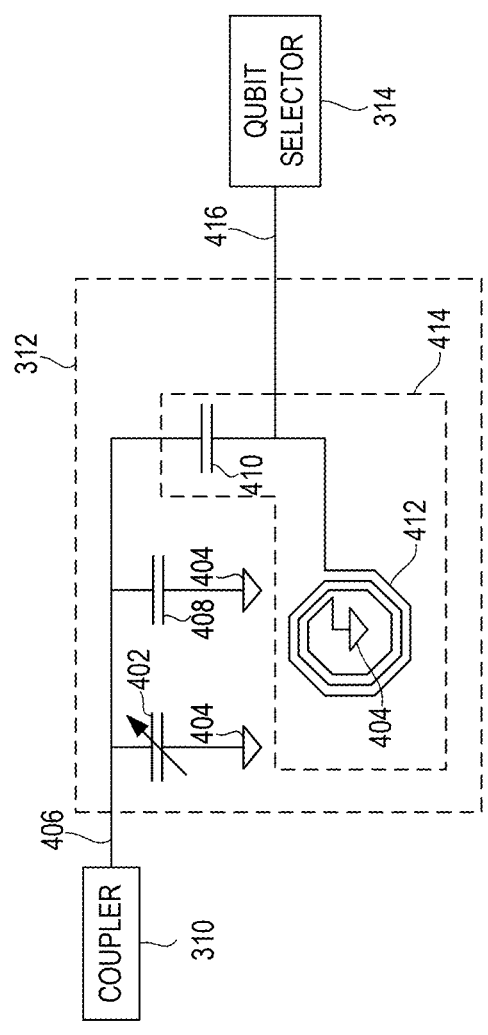
FIG. 4 illustrates an example embodiment of the impedance matching network of FIG. 3.

Referring now to FIG. 4, in one embodiment, the impedance matching network 312 is shown in more detail. The impedance matching network 312 includes a varactor 402 connected across an input 406 and ground 404. One or more additional capacitors 408 are connected across the input 406 and ground 404. A series capacitor 410 is connected across the input 406 and an output 416 that is connected to the qubit selector 314. An inductor 412 is connected across the output 416 and the ground 404.

The impedance transformation ratio of the impedance matching network 312 shown in FIG. 4 is approximately the square of the ratio of the capacitance of the parallel capacitors 402, 408 ($C_P$) to the capacitance of the series capacitor 410 ($C_S$) (i.e., the impedance matching ratio is $(C_P/C_S)^2$), neglecting the capacitance of the qubit selector 314 and the connection to the qubit. The matching frequency of the impedance matching network 312 shown in FIG. 4 is $1/\sqrt{LC_{EQ}}$, where L is the inductance of the inductor 412 and $C_{EQ}$ is the equivalent capacitance of the parallel capacitors 402, 408 and the series capacitor 410. The capacitance of the capacitor 408 and the varactor 402 may be selected so that the varactor 402 that can have a capacitance of 10%-100% of its maximum value can tune the impedance transformation ratio of the impedance matching network 312 by, e.g., a factor of three. For example, in one embodiment, the varactor 402 may be able to tune the impedance transformation ratio between 2,000 and 6,000.

As opposed to a traditional impedance matching network, which may be made up of, e.g., a single inductor between the coupler 310 and the qubit selector 314 (see discussion regarding FIG. 7 below), the impedance matching network 312 shown in FIG. 4 has several advantages. As the impedance transformation ratio is relatively high, $C_P$ is much greater than $C_S$. As a result, $C_{EQ}$ (and, therefore, the matching frequency) is mostly independent of $C_S$, decoupling the impedance transformation ratio and the matching frequency of the impedance matching network 312. For example, in one embodiment, changing the capacitance $C_P$ of the parallel capacitors 402, 408 by, e.g., a factor of two (changing the impedance transformation by about a factor of four), may change the matching frequency by less than 1%, such as 1-0.01%. As the impedance matching ratio of the impedance matching network 312 is high, such as over 1,000, the quality factor (or Q factor) of the resonator formed by the series capacitor 410 and the inductor 412 must be high (e.g., over 10,000). However, the parallel capacitors 402, 408 are shorted to the low source impedance of, e.g., 50Ω, relaxing the Q factor required of the parallel capacitors 402, 408 and, therefore, allowing use of a varactor 402 with a relatively low Q factor.

In the illustrative embodiment, the capacitor 402 is a cryogenic varactor with a controllable tuning range of, e.g., 10-100% of a maximum value. The varactor may be controlled by an input voltage (not shown in FIG. 4). In other embodiments, the capacitor 402 may be embodied as any suitable type of variable capacitor. In the illustrative embodiment, the capacitor 402 has a capacitance of, e.g., 5 pF. The capacitor 402 may have any suitable maximum capacitance, such as 1-30 pF. The capacitance of the capacitor 402 may be used to tune the impedance transformation ratio of the impedance matching network 312 in order to, e.g., match the impedance of the stimulus source 302 to the impedance of the circuit that interfaces with the qubits. In the illustrative embodiment, the Q factor of the capacitor 402 may be relatively low, such as 10-100. In other embodiments, the Q factor of the capacitor 402 may be higher.

In the illustrative embodiment, components in a superconducting area 414 of the impedance matching network 312 are made of a superconductor material that is superconducting at an operating temperature of the impedance matching network 312. In particular, the capacitor 410, the inductor 412, and connections between the capacitor 410 and the inductor 412 are made of a material that is superconducting at an operating temperature of the impedance matching network 312. For example, the capacitor 410 and the inductor 412 may be made of titanium nitride, niobium nitride, niobium, aluminum, and/or any other suitable material. The operating temperature of the impedance matching network 312 may be, e.g., 4-0.01 Kelvin. As the resistive loss of the superconducting components is zero, the Q factor of the capacitor 410 and the inductor 412 may be relatively high. As used herein, a superconductor refers to a material that is superconducting below a critical temperature, and a superconductor can refer to such a material even when it is above the critical temperature.

In the illustrative embodiment, some or all of the components in the superconducting area 414 may be on a different layer of the die 304 as other components, such as semiconductor components, as fabricating superconducting traces directly on a semiconductor layer may be difficult or infeasible. In particular, transistors 316 and the amplifier 322 may be on a semiconductor layer (e.g., a silicon layer), and the components in the superconducting area 414 may be on a layer above the semiconductor layer, with a dielectric layer in between, such as silicon dioxide. Vias may connect the components in the superconducting area 414 to other components on the die 304.

In the illustrative embodiment, control of the parallel capacitance is based on changes to the variable capacitor 402. Additionally or alternatively, in some embodiments, the capacitor 408 may be made up of several capacitors, connections to which may be able to be controlled digitally, such as by the presence of a transistor in series with the capacitor (not shown in FIG. 4).

In the illustrative embodiment, control circuitry such as quantum/classical interface circuitry 208 is configured to control the capacitance of the varactor 402. For example, the quantum/classical interface circuitry 208 or other circuitry may measure or otherwise determine parameters of the circuit coupled to the qubit in the spin-up and spin-down states, as discussed in more detail below in regard to FIGS. 5 and 6. The quantum/classical interface circuitry 208 may control the capacitance of the capacitor 402 based on the parameters of the circuit coupled to the qubit in the spin-up and/or spin-down states. In other embodiments, the quantum/classical interface circuitry 208 or other control circuitry may control the capacitance of the capacitor 402 based on other parameters, such as a signal reflected from the circuit coupled to the qubit.

In the illustrative embodiment, the capacitance of the series capacitor 410 is, e.g., 1 pF. In other embodiments, the capacitance of the series capacitor 410 may be any suitable value, such as 0.3-10 pF. In the illustrative embodiment, the capacitor 410 has a relatively high Q factor at an operating temperature and matching frequency of the impedance matching network 312, such as a Q factor of 1,000-50,000. In the illustrative embodiment, the Q factor of the capacitor 410 at an operating temperature of the impedance matching network 312 is over 10,000.

In the illustrative embodiment, the inductance of the inductor 412 is, e.g., 300 nH. In other embodiments, the inductance of the inductor 412 may be any suitable value, such as 50-1,000 nH. In the illustrative embodiment, the inductor 412 has a relatively high Q factor at an operating temperature and matching frequency of the impedance matching network 312, such as a Q factor of 1,000-50,000. In the illustrative embodiment, the Q factor of the inductor 412 at an operating temperature of the impedance matching network 312 is over 10,000.

In the illustrative embodiment, the characteristic impedance of components from the stimulus source 302 to the impedance matching networks 312 (such as lines connecting various components, the couplers 310, etc.) is 50 Ohms, and the impedance matching network 312 matches a 50Ω impedance of the stimulus source 302 to a circuit with a 100 kΩ impedance, giving an impedance transformation ratio of 2,000. In other embodiments, the impedance transformation ratio may be any suitable value, such as 500 to 10,000, and/or the characteristic impedance of components may be a different impedance, such as 40-200 Ohms.

Referring back to FIG. 3, the illustrative amplifier 322 is a low-noise amplifier that amplifies signals that reflect from the impedance matching networks 312. The amplifier 322 may have any suitable gain, such as a gain of 10-60 dB. The amplifier 322 has a bandwidth that can amplify signals from the stimulus source 302. For example, the amplifier 322 may amplify signals between, e.g., 1 MHz to 1 GHZ. The amplifier 322 may have any suitable bandwidth, such as 100 MHz to 5 GHZ.

The receiver 328 may be any suitable receiver capable of measuring the signal from the stimulus source 302 that is reflected from the impedance matching network 312. For example, the receiver 328 may be embodied as an RF power meter, a network analyzer, a spectrum analyzer, etc. The receiver 328 may include one or more amplifiers, mixers, or other components. In some embodiments, the receiver 328 may include one or more IQ mixers and/or other components in order to measure both the in-phase and quadrature components of the reflected signal.

In the illustrative embodiment, some or all of the components of the system 300 may be in a cryogenic refrigerator. For example, the die 304 and all of its components, the qubits, etc., may be held at, e.g., 10 millikelvin. The stimulus source 302 and/or the receiver 328 may be at a higher temperature region of the refrigerator (such as a 4 Kelvin region) or may be outside of the refrigerator.

In the illustrative embodiment, the quantum/classical interface circuitry 208 or other control circuitry includes or otherwise interfaces with the stimulus source 302 and/or the receiver 328. In the illustrative embodiment, the quantum/classical interface circuitry 208 includes the die 304. The quantum/classical interface circuitry 208 can control, e.g., the frequency, pulse width, amplitude, etc., of pulses from the stimulus source 302. The quantum/classical interface circuitry 208 may determine parameters of the pulse to generate based on, e.g., measured or stored parameters of the impedance matching networks 312 and/or the circuits that interface with the qubits.

It should be appreciated that the combination of different frequencies separated by the couplers 310 and different qubits selectable by the qubit selectors 314 allows the die 304 to interface with a large number of qubits through a single input channel connected to the stimulus source 302. For example, if there are 100 frequency channels (i.e., 100 couplers 310, impedance matching networks 312, etc.) and 20 transistors 316 in each qubit selector 314, then the die 304 can interface with up to 2,000 qubits. More generally, the die 304 can interface with 1-2,000 qubits.

Figure 5:
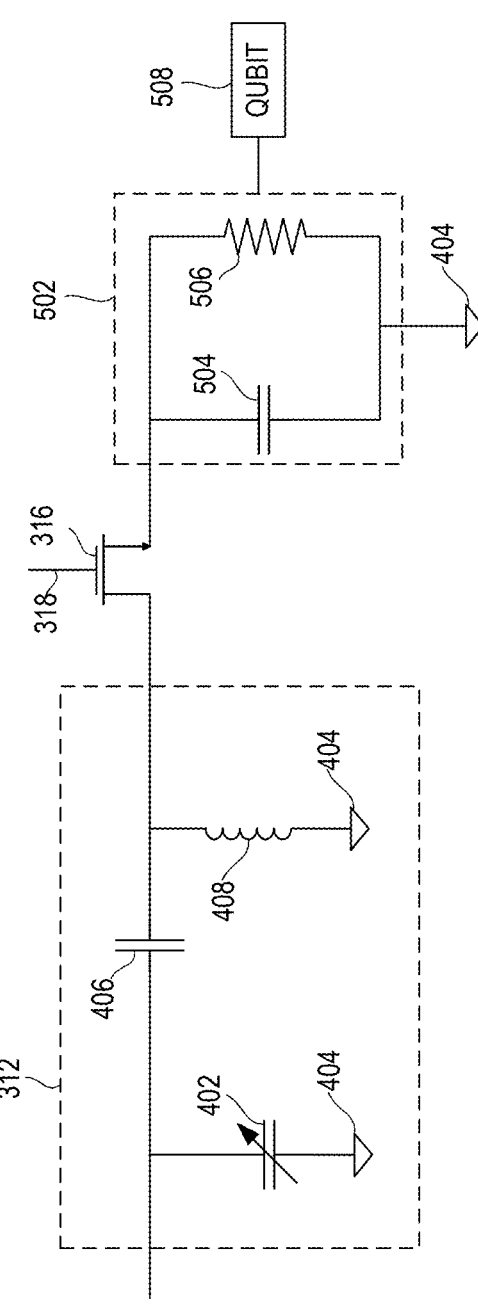
FIG. 5 illustrates an example embodiment of the impedance matching network of FIG. 4 interfacing with a spin qubit.

Referring now to FIG. 5, in one embodiment, a circuit diagram shows how an impedance matching network 312 can interface with a qubit. An output of the impedance matching network 312 is connected to a circuit 502 that interfaces with a qubit 508. In the illustrative embodiment, transistors 316 select which of several qubits 508 the output of the impedance matching network 312 will be linked to. In the illustrative embodiment, a single electron transistor 502, represented as a capacitor 504 and a resistor 506 connected in parallel between the impedance matching network 312 and the ground 404. The resistance of the single-electron transistor 502 depends on a state of the qubit 508. The impedance matching network 312 can convert between the impedance of the stimulus source 302 and the impedance of the single-electron transistor 502.

In the illustrative embodiment, the single-electron transistor 502 has a resistance represented by the resistor 506 that depends on the state of the qubit 508. For example, in one embodiment, if the qubit 508 is in a zero state (e.g., spin down), then the resistance of the resistor 506 may be 100Ω, and if the qubit 508 is in a one state (e.g., spin up), then the resistance of the resistor 506 may be 105Ω. The resistance of the resistor 506 may increase only temporarily when the qubit 508 is measured to be in a spin up state.

The single-electron transistor 502 may be any suitable single-electron transistor, such as a single-electron transistor based on a semiconductor quantum dot. As used herein, a single-electron transistor includes few-electron transistors and does not necessarily operate in the single electron regime unless explicitly stated otherwise, despite the name. In the illustrative embodiment, the single-electron transistor 502 operates in the regime of approximately 100 electrons. In some embodiments, the single-electron transistor 502 may be replaced with a different qubit.

In the illustrative embodiment, the qubit 508 is a spin qubit, and the qubit is capacitively coupled to the gate of the single-electron transistor 502. As such, the number of electrons in the qubit 508 affects the voltage on the gate of the single-electron transistor 502. The state of the qubit 508 can be read using an Elzerman readout. When the spin qubit is in a spin up state, the electron that forms the spin qubit 508 can transition out of the qubit 508 temporarily, changing the resistance of the transistor 502 (i.e., the resistance of the resistor 506) for a period of time. The electron can then transition back to the qubit 508 in the spin down state. As such, in the illustrative embodiment, the transistor 502 is only in the high-resistance state for the resistor 506 for only part of the measurement period. For example, in a measurement period of 1 millisecond, the transistor 502 may be in a high-resistance state for 100 microseconds. More generally, for a measurement period of, e.g., 0.1-10 milliseconds, the transistor 502 may be in a high-resistance state for, e.g., 0.1-1,000 microseconds.

In use, in the illustrative embodiment, when the electron of the qubit 508 is in a spin-down state, the resistance of the transistor 502 as represented by the resistor 506 is at a lower resistance value of, e.g., 50-500 kΩ. When the electron of the qubit 508 starts in a spin-up state and transitions out of the qubit 508 temporarily, the resistance of the transistor 502 as represented by the resistor 506 is at a higher resistance value of, e.g., 55-550 kΩ. The ratio of the high resistance value to the low resistance value of the resistor 506 may be any suitable value, such as 1.02-50. In the illustrative embodiment, the resistance of the resistor 506 is 100 kΩ and 105 kΩ at the low-resistance and high-resistance values, respectively.

In the illustrative embodiment, the impedance matching network 312 is configured to match the impedance of the stimulus source 302 and other connections to the impedance of the single-electron transistor 502 in the low-impedance state (e.g., when the resistance of the resistor 506 is 100 kΩ, in the example above). As such, when the single-electron transistor 502 is in the low-impedance state, the signal from the stimulus source 302 will be almost completely absorbed. When the single-electron transistor 502 is in the high-impedance state, a significant portion of the signal sent from the stimulus source 302 will be reflected back to the coupler 310 and to the receiver 328. As discussed in more detail below in regard to FIG. 4, the illustrative impedance matching network 312 can be tuned for a particular impedance matching ratio at a particular stimulus frequency.

Figure 6:
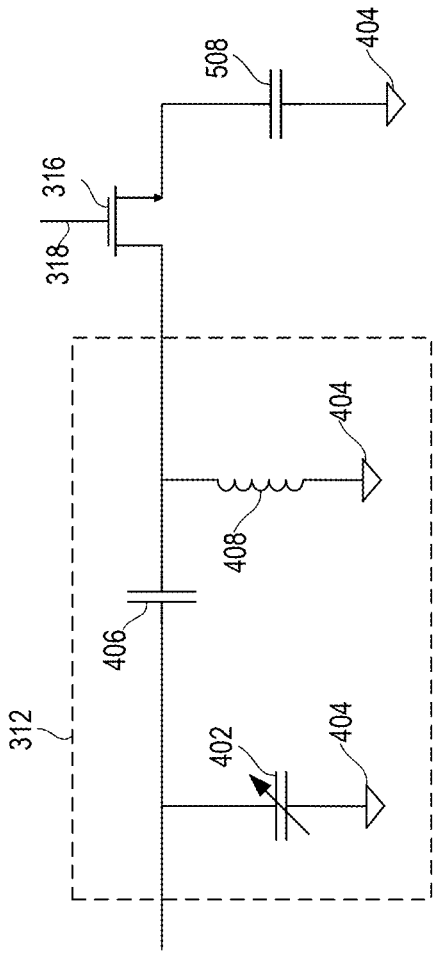
FIG. 6 illustrates an example embodiment of the impedance matching network of FIG. 4 interfacing with a spin qubit.

In the illustrative embodiment, the system 300 includes a single-electron transistor 502 coupled to a spin qubit 508. More generally, it should be appreciated that the system 300 may include any suitable component in place of the single-electron transistor 502 whose impedance depends on the state of the qubit 508, which may be any suitable type of qubit. For example, as shown in FIG. 6, in one embodiment, the capacitance of the qubit 508 (represented in FIG. 6 as a capacitor) can be sensed in a similar manner as the resistance of the transistor 502, allowing the state of the qubit 508 to be detected in a similar manner.

Figure 7:
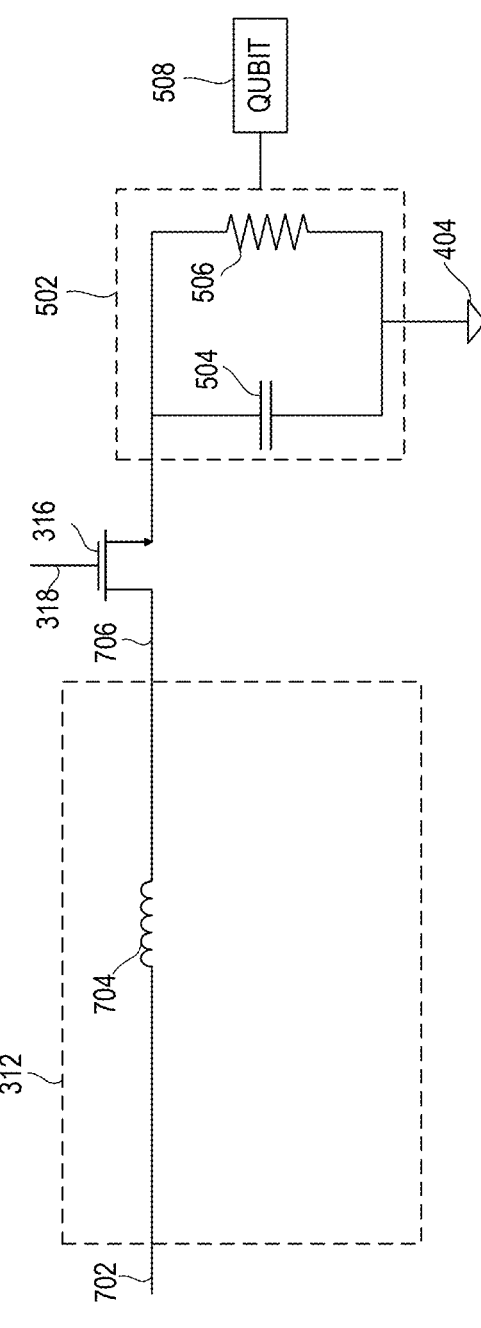
FIG. 7 illustrates an example embodiment of an impedance matching network interfacing with a spin qubit.

Referring now to FIG. 7, it should be appreciated that, in some embodiments, an impedance matching network 312 other than the one shown in FIG. 4 may be used. For example, in some embodiments, an impedance matching network 312 that includes an inductor 704 connected between an input 702 and an output 706 may be used. Although such an impedance matching network 312 does not have certain benefits such as tunability that the impedance matching network 312 of FIG. 4 does, the impedance matching network 312 shown in FIG. 7 can be tuned to match an impedance higher than that of the single-electron transistor 502 to the stimulus source 302.

Figure 8:
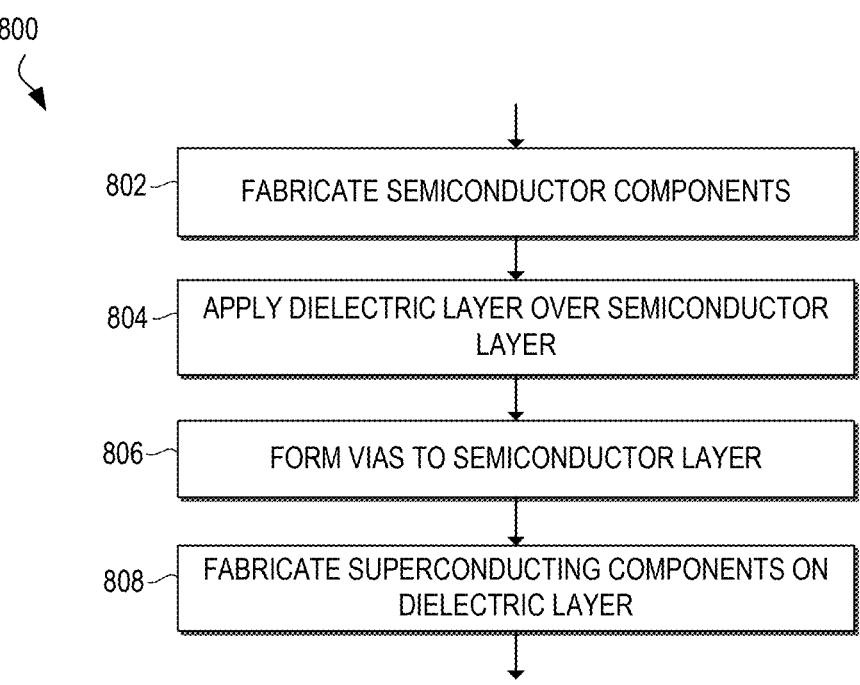
FIG. 8 is a simplified flow diagram of at least one embodiment of a method for creating the die of FIG. 3.

Referring now to FIG. 8, in one embodiment, a flowchart for a method 800 for manufacturing the system 300 is shown. The method 800 may be executed by a technician and/or by one or more automated machines. In some embodiments, one or more machines may be programmed to do some or all of the steps of the method 800. Such a machine may include, e.g., a memory, a processor, data storage, etc. The memory and/or data storage may store instructions that, when executed by the machine, causes the machine to perform some or all of the steps of the method 800. The method 800 may use any suitable set of techniques that are used in semiconductor or printed circuit board processing, such as chemical vapor deposition, atomic layer deposition, physical layer deposition, molecular beam epitaxy, layer transfer, photolithography, ion implantation, dry etching, wet etching, thermal treatments, flip chip, layer transfer, magnetron sputter deposition, pulsed laser deposition, etc. It should be appreciated that the method 800 is merely one embodiment of a method to create the system 300, and other methods may be used to create the system 300.

The method 800 begins in block 802, in which semiconductor components are fabricated on a wafer. In the illustrative embodiment, components such as the amplifier 322 and transistors 316 are fabricated in block 802, as well as connections and linear electronics such as the couplers 310. The illustrative embodiment, the semiconductor components are fabricated on a silicon wafer, but, in some embodiments, other semiconductor materials may be used as well.

In block 804, a dielectric layer is applied over the semiconductor layer. In the illustrative embodiment, the dielectric layer is silicon dioxide. In block 806, vias are formed through the dielectric layer to the semiconductor layer below it, allowing for connections between components in the semiconductor layer to components above the dielectric layer.

In block 808, superconducting components are fabricated on the dielectric layer. In the illustrative embodiment, the inductors 412 and series capacitors 410 are fabricated from superconducting components. After the superconducting components are fabricated, the wafer may be singulated, and individual dies 304 may be incorporated into a system 300.

Figure 9:
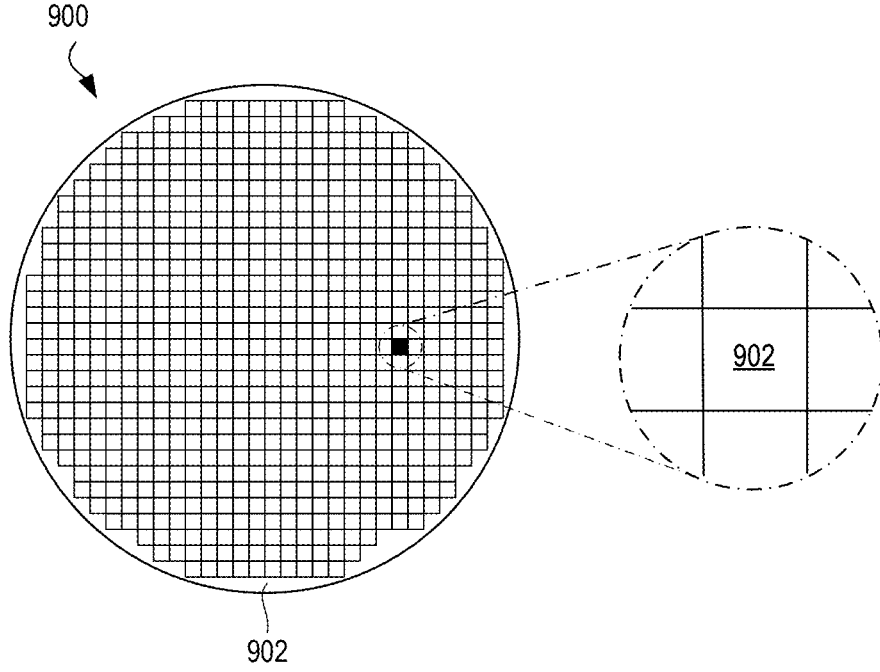
FIG. 9 is a top view of a wafer and dies, in accordance with any of the embodiments disclosed herein.

FIG. 9 is a top view of a wafer 900 and dies 902 that may be included in any of the chips 304 disclosed herein. The wafer 900 may be composed of semiconductor material and may include one or more dies 902 having integrated circuit structures formed on a surface of the wafer 900. The individual dies 902 may be a repeating unit of an integrated circuit product that includes any suitable integrated circuit. After the fabrication of the semiconductor product is complete, the wafer 900 may undergo a singulation process in which the dies 902 are separated from one another to provide discrete "chips" of the integrated circuit product. The die 902 may be any of the dies 304. The die 902 may include one or more transistors (e.g., some of the transistors 1040 of FIG. 10, discussed below), supporting circuitry to route electrical signals to the transistors, passive components (e.g., signal traces, resistors, capacitors, or inductors), and/or any other integrated circuit components. In some embodiments, the wafer 900 or the die 902 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 902. For example, a memory array formed by multiple memory devices may be formed on a same die 902 as a processor unit (e.g., the processor unit 1302 of FIG. 13) or other logic that is configured to store information in the memory devices or execute instructions stored in the memory array. Various ones of the dies 304 disclosed herein may be manufactured using a die-to-wafer assembly technique in which some dies 304 are attached to a wafer 900 that include others of the dies 304, and the wafer 900 is subsequently singulated.

Figure 10:
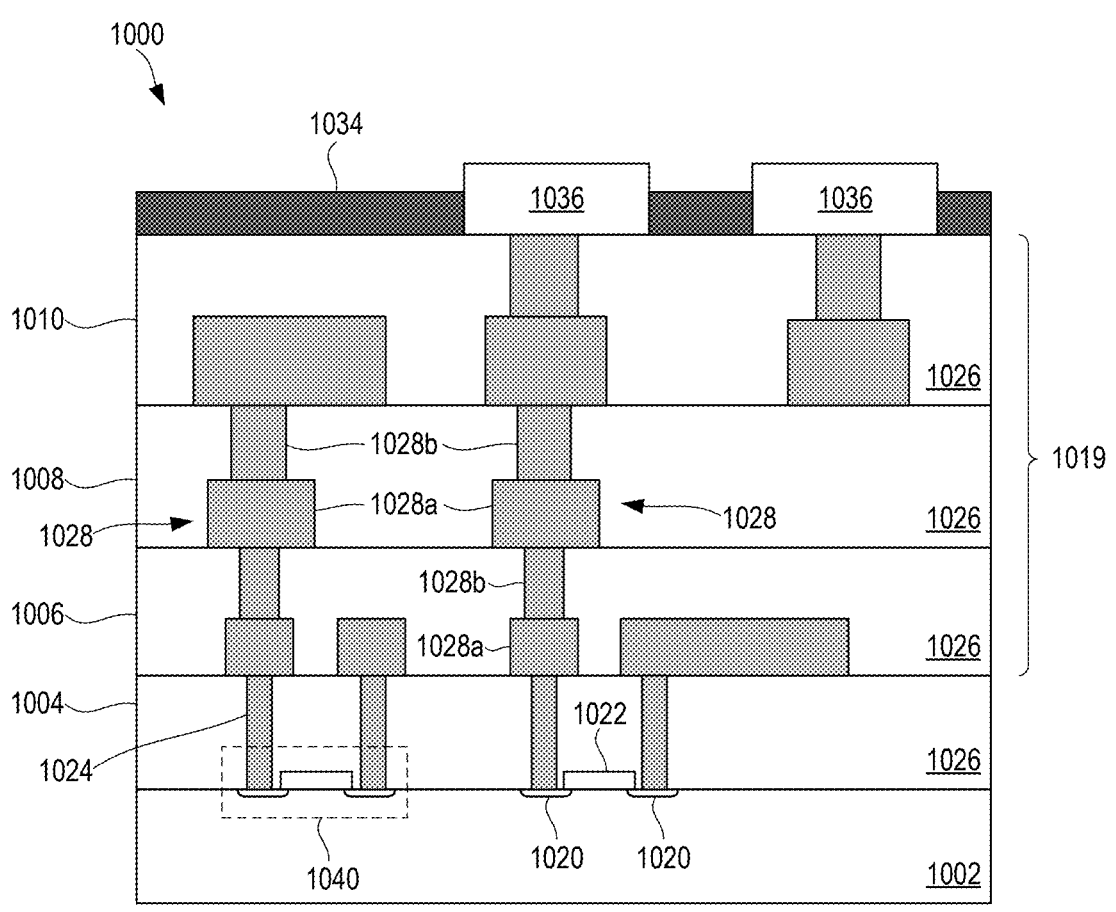
FIG. 10 is a cross-sectional side view of an integrated circuit, in accordance with any of the embodiments disclosed herein.

FIG. 10 is a cross-sectional side view of an integrated circuit device 1000 that may be included in any of the dies 304 disclosed herein. One or more of the integrated circuit devices 1000 may be included in one or more dies 902 (FIG. 9). The integrated circuit device 1000 may be formed on a die substrate 1002 (e.g., the wafer 900 of FIG. 9) and may be included in a die (e.g., the die 902 of FIG. 9). The die substrate 1002 may be a semiconductor substrate composed of semiconductor material systems including, for example, n-type or p-type materials systems (or a combination of both). The die substrate 1002 may include, for example, a crystalline substrate formed using a bulk silicon or a silicon-on-insulator (SOI) substructure. In some embodiments, the die substrate 1002 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1002. Although a few examples of materials from which the die substrate 1002 may be formed are described here, any material that may serve as a foundation for an integrated circuit device 1000 may be used. The die substrate 1002 may be part of a singulated die (e.g., the dies 902 of FIG. 9) or a wafer (e.g., the wafer 900 of FIG. 9).

The integrated circuit device 1000 may include one or more device layers 1004 disposed on the die substrate 1002. The device layer 1004 may include features of one or more transistors 1040 (e.g., metal oxide semiconductor field-effect transistors (MOSFETs)) formed on the die substrate 1002. The transistors 1040 may include, for example, one or more source and/or drain (S/D) regions 1020, a gate 1022 to control current flow between the S/D regions 1020, and one or more S/D contacts 1024 to route electrical signals to/from the S/D regions 1020. The transistors 1040 may include additional features not depicted for the sake of clarity, such as device isolation regions, gate contacts, and the like. The transistors 1040 are not limited to the type and configuration depicted in FIG. 10 and may include a wide variety of other types and configurations such as, for example, planar transistors, non-planar transistors, or a combination of both.

Non-planar transistors may include FinFET transistors, such as double-gate transistors or tri-gate transistors, and wrap-around or all-around gate transistors, such as nanoribbon, nanosheet, or nanowire transistors.

FIGS. 11A-11D are simplified perspective views of example planar, FinFET, gate-all-around, and stacked gate-all-around transistors. The transistors illustrated in FIGS. 11A-11D are formed on a substrate 1116 having a surface 1108. Isolation regions 1114 separate the source and drain regions of the transistors from other transistors and from a bulk region 1118 of the substrate 1116.

Figure 11A:
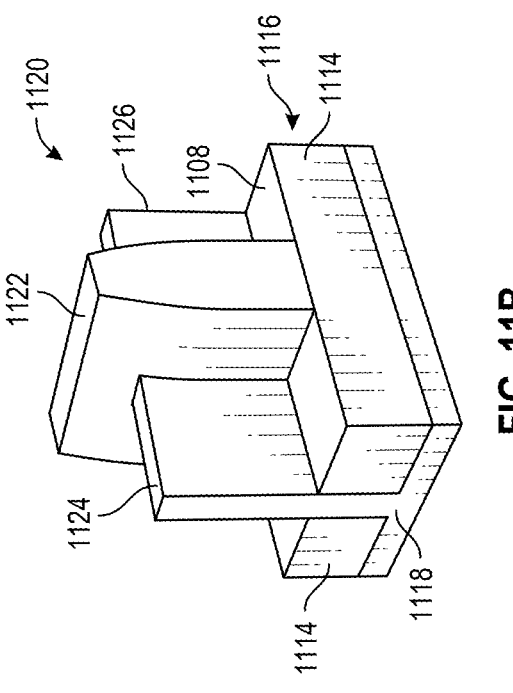
FIGS. 11A-11D are perspective views of example planar, gate-all-around, and stacked gate-all-around transistors.

FIG. 11A is a perspective view of an example planar transistor 1100 comprising a gate 1102 that controls current flow between a source region 1104 and a drain region 1106. The transistor 1100 is planar in that the source region 1104 and the drain region 1106 are planar with respect to the substrate surface 1108.

Figure 11B:
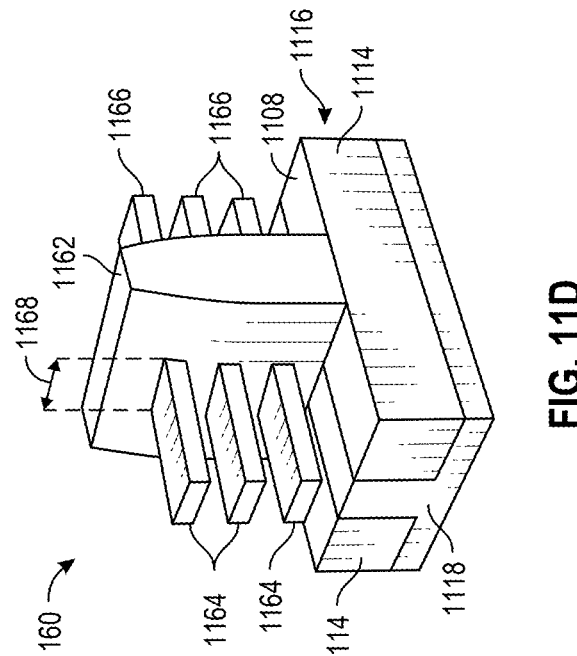

FIG. 11B is a perspective view of an example FinFET transistor 1120 comprising a gate 1122 that controls current flow between a source region 1124 and a drain region 1126. The transistor 1120 is non-planar in that the source region 1124 and the drain region 1126 comprise "fins" that extend upwards from the substrate surface 1128. As the gate 1122 encompasses three sides of the semiconductor fin that extends from the source region 1124 to the drain region 1126, the transistor 1120 can be considered a tri-gate transistor. FIG. 11B illustrates one S/D fin extending through the gate 1122, but multiple S/D fins can extend through the gate of a FinFET transistor.

Figure 11C:
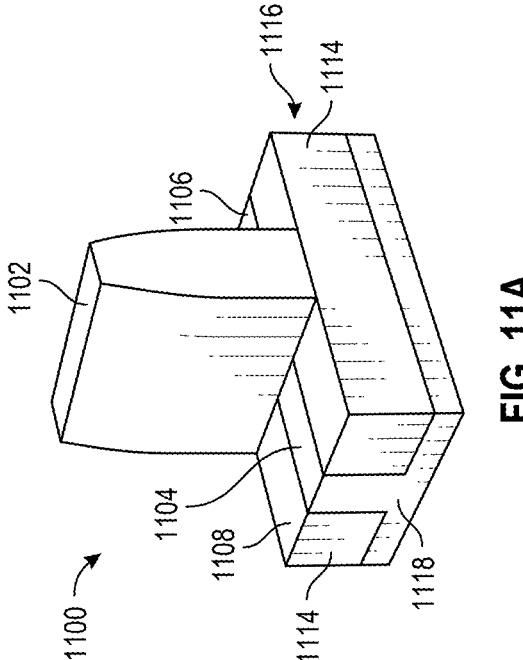

FIG. 11C is a perspective view of a gate-all-around (GAA) transistor 1140 comprising a gate 1142 that controls current flow between a source region 1144 and a drain region 1146. The transistor 1140 is non-planar in that the source region 1144 and the drain region 1146 are elevated from the substrate surface 1128.

Figure 11D:
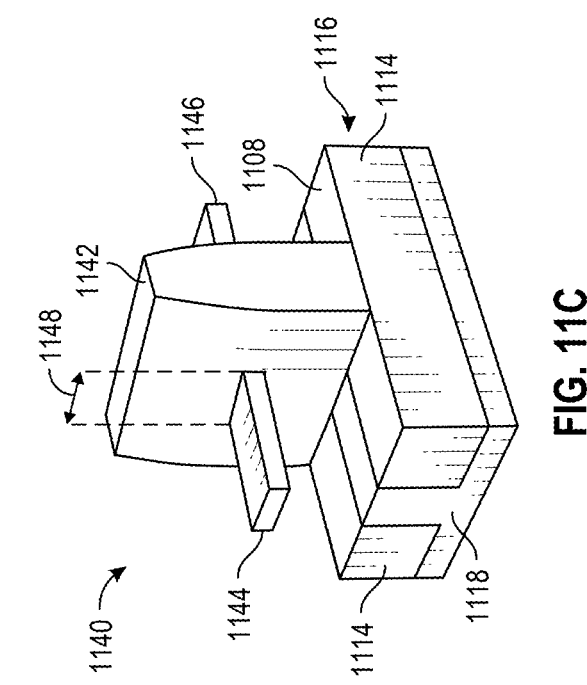

FIG. 11D is a perspective view of a GAA transistor 1160 comprising a gate 1162 that controls current flow between multiple elevated source regions 1164 and multiple elevated drain regions 1166. The transistor 1160 is a stacked GAA transistor as the gate controls the flow of current between multiple elevated S/D regions stacked on top of each other. The transistors 1140 and 1160 are considered gate-all-around transistors as the gates encompass all sides of the semiconductor portions that extends from the source regions to the drain regions. The transistors 1140 and 1160 can alternatively be referred to as nanowire, nanosheet, or nanoribbon transistors depending on the width (e.g., widths 1148 and 1168 of transistors 1140 and 1160, respectively) of the semiconductor portions extending through the gate.

Returning to FIG. 10, a transistor 1040 may include a gate 1022 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1040 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1040 along the source-channel-drain direction, the gate electrode may consist of a U-shaped structure that includes a bottom portion substantially parallel to the surface of the die substrate 1002 and two sidewall portions that are substantially perpendicular to the top surface of the die substrate 1002. In other embodiments, at least one of the metal layers that form the gate electrode may simply be a planar layer that is substantially parallel to the top surface of the die substrate 1002 and does not include sidewall portions substantially perpendicular to the top surface of the die substrate 1002. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1020 may be formed within the die substrate 1002 adjacent to the gate 1022 of individual transistors 1040. The S/D regions 1020 may be formed using an implantation/diffusion process or an etching/deposition process, for example. In the former process, dopants such as boron, aluminum, antimony, phosphorous, or arsenic may be ion-implanted into the die substrate 1002 to form the S/D regions 1020. An annealing process that activates the dopants and causes them to diffuse farther into the die substrate 1002 may follow the ion-implantation process. In the latter process, the die substrate 1002 may first be etched to form recesses at the locations of the S/D regions 1020. An epitaxial deposition process may then be carried out to fill the recesses with material that is used to fabricate the S/D regions 1020. In some implementations, the S/D regions 1020 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1020 may be formed using one or more alternate semiconductor materials such as germanium or a group III-V material or alloy. In further embodiments, one or more layers of metal and/or metal alloys may be used to form the S/D regions 1020.

Electrical signals, such as power and/or input/output (I/O) signals, may be routed to and/or from the devices (e.g., transistors 1040) of the device layer 1004 through one or more interconnect layers disposed on the device layer 1004 (illustrated in FIG. 10 as interconnect layers 1006-1010). For example, electrically conductive features of the device layer 1004 (e.g., the gate 1022 and the S/D contacts 1024) may be electrically coupled with the interconnect structures 1028 of the interconnect layers 1006-1010. The one or more interconnect layers 1006-1010 may form a metallization stack (also referred to as an "ILD stack") 1019 of the integrated circuit device 1000.

The interconnect structures 1028 may be arranged within the interconnect layers 1006-1010 to route electrical signals according to a wide variety of designs; in particular, the arrangement is not limited to the particular configuration of interconnect structures 1028 depicted in FIG. 10. Although a particular number of interconnect layers 1006-1010 is depicted in FIG. 10, embodiments of the present disclosure include integrated circuit devices having more or fewer interconnect layers than depicted.

In some embodiments, the interconnect structures 1028 may include lines 1028a and/or vias 1028b filled with an electrically conductive material such as a metal. The lines 1028a may be arranged to route electrical signals in a direction of a plane that is substantially parallel with a surface of the die substrate 1002 upon which the device layer 1004 is formed. For example, the lines 1028a may route electrical signals in a direction in and out of the page and/or in a direction across the page. The vias 1028b may be arranged to route electrical signals in a direction of a plane that is substantially perpendicular to the surface of the die substrate 1002 upon which the device layer 1004 is formed. In some embodiments, the vias 1028b may electrically couple lines 1028a of different interconnect layers 1006-1010 together.

The interconnect layers 1006-1010 may include a dielectric material 1026 disposed between the interconnect structures 1028, as shown in FIG. 10. In some embodiments, dielectric material 1026 disposed between the interconnect structures 1028 in different ones of the interconnect layers 1006-1010 may have different compositions; in other embodiments, the composition of the dielectric material 1026 between different interconnect layers 1006-1010 may be the same. The device layer 1004 may include a dielectric material 1026 disposed between the transistors 1040 and a bottom layer of the metallization stack as well. The dielectric material 1026 included in the device layer 1004 may have a different composition than the dielectric material 1026 included in the interconnect layers 1006-1010; in other embodiments, the composition of the dielectric material 1026 in the device layer 1004 may be the same as a dielectric material 1026 included in any one of the interconnect layers 1006-1010.

A first interconnect layer 1006 (referred to as Metal 1 or "M1") may be formed directly on the device layer 1004. In some embodiments, the first interconnect layer 1006 may include lines 1028*a* and/or vias 1028*b*, as shown. The lines 1028*a* of the first interconnect layer 1006 may be coupled with contacts (e.g., the S/D contacts 1024) of the device layer 1004. The vias 1028*b* of the first interconnect layer 1006 may be coupled with the lines 1028*a* of a second interconnect layer 1008.

The second interconnect layer 1008 (referred to as Metal 2 or "M2") may be formed directly on the first interconnect layer 1006. In some embodiments, the second interconnect layer 1008 may include via 1028*b* to couple the lines 1028 of the second interconnect layer 1008 with the lines 1028*a* of a third interconnect layer 1010. Although the lines 1028*a* and the vias 1028*b* are structurally delineated with a line within individual interconnect layers for the sake of clarity, the lines 1028*a* and the vias 1028*b* may be structurally and/or materially contiguous (e.g., simultaneously filled during a dual-damascene process) in some embodiments.

The third interconnect layer 1010 (referred to as Metal 3 or "M3") (and additional interconnect layers, as desired) may be formed in succession on the second interconnect layer 1008 according to similar techniques and configurations described in connection with the second interconnect layer 1008 or the first interconnect layer 1006. In some embodiments, the interconnect layers that are "higher up" in the metallization stack 1019 in the integrated circuit device 1000 (i.e., farther away from the device layer 1004) may be thicker that the interconnect layers that are lower in the metallization stack 1019, with lines 1028*a* and vias 1028*b* in the higher interconnect layers being thicker than those in the lower interconnect layers.

The integrated circuit device 1000 may include a solder resist material 1034 (e.g., polyimide or similar material) and one or more conductive contacts 1036 formed on the interconnect layers 1006-1010. In FIG. 10, the conductive contacts 1036 are illustrated as taking the form of bond pads. The conductive contacts 1036 may be electrically coupled with the interconnect structures 1028 and configured to route the electrical signals of the transistor(s) 1040 to external devices. For example, solder bonds may be formed on the one or more conductive contacts 1036 to mechanically and/or electrically couple an integrated circuit die including the integrated circuit device 1000 with another component (e.g., a printed circuit board). The integrated circuit device 1000 may include additional or alternate structures to route the electrical signals from the interconnect layers 1006-1010; for example, the conductive contacts 1036 may include other analogous features (e.g., posts) that route the electrical signals to external components.

In some embodiments in which the integrated circuit device 1000 is a double-sided die, the integrated circuit device 1000 may include another metallization stack (not shown) on the opposite side of the device layer(s) 1004. This metallization stack may include multiple interconnect layers as discussed above with reference to the interconnect layers 1006-1010, to provide conductive pathways (e.g., including conductive lines and vias) between the device layer(s) 1004 and additional conductive contacts (not shown) on the opposite side of the integrated circuit device 1000 from the conductive contacts 1036.

In other embodiments in which the integrated circuit device 1000 is a double-sided die, the integrated circuit device 1000 may include one or more through silicon vias (TSVs) through the die substrate 1002; these TSVs may make contact with the device layer(s) 1004, and may provide conductive pathways between the device layer(s) 1004 and additional conductive contacts (not shown) on the opposite side of the integrated circuit device 1000 from the conductive contacts 1036. In some embodiments, TSVs extending through the substrate can be used for routing power and ground signals from conductive contacts on the opposite side of the integrated circuit device 1000 from the conductive contacts 1036 to the transistors 1040 and any other components integrated into the die 1000, and the metallization stack 1019 can be used to route I/O signals from the conductive contacts 1036 to transistors 1040 and any other components integrated into the die 1000.

Multiple integrated circuit devices 1000 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 12:
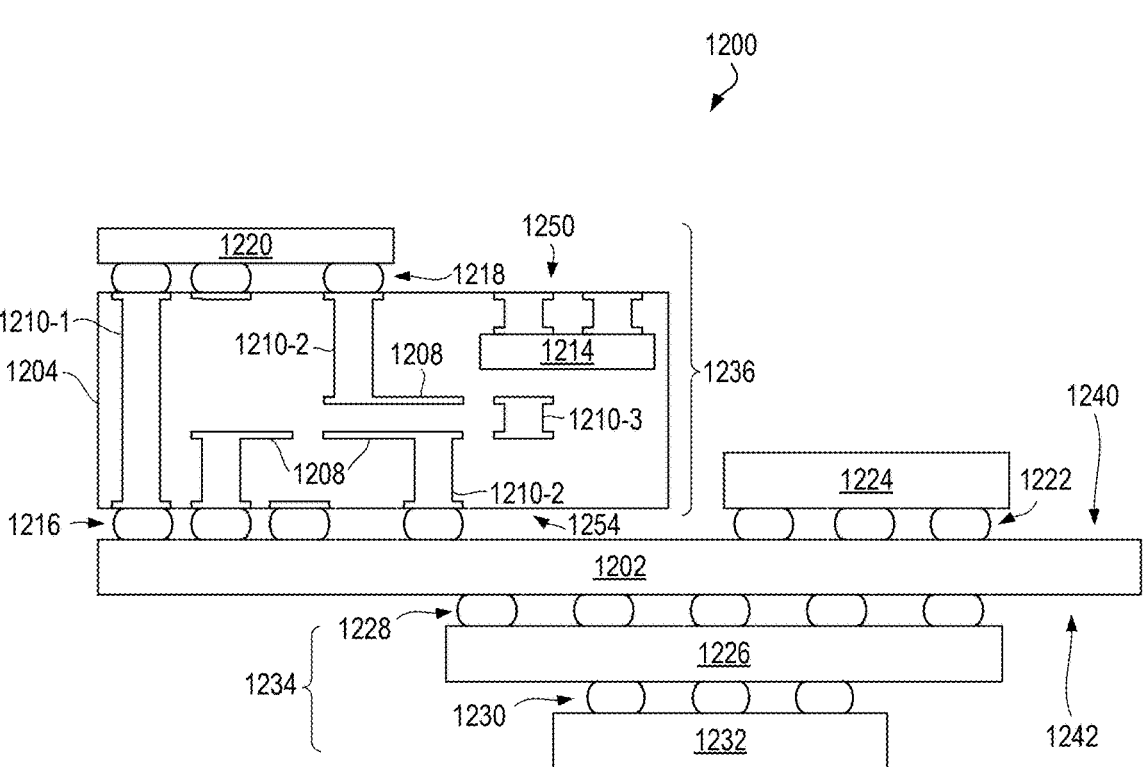
FIG. 12 is a cross-sectional side view of an integrated circuit device assembly, in accordance with any of the embodiments disclosed herein.

FIG. 12 is a cross-sectional side view of an integrated circuit device assembly 1200. In some embodiments, the integrated circuit device assembly 1200 may include or be included in the dies 304. The integrated circuit device assembly 1200 includes a number of components disposed on a circuit board 1202 (which may be a motherboard, system board, mainboard, etc.). The integrated circuit device assembly 1200 includes components disposed on a first face 1240 of the circuit board 1202 and an opposing second face 1242 of the circuit board 1202; generally, components may be disposed on one or both faces 1240 and 1242. Any of the integrated circuit components discussed below with reference to the integrated circuit device assembly 1200 may include or be included in any suitable ones of the embodiments of the dies 304 disclosed herein.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The integrated circuit device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpacked integrated circuit product that includes one or more integrated circuit dies (e.g., the die 902 of FIG. 9, the integrated circuit device 1000 of FIG. 10) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1220, a single monolithic integrated circuit die comprises solder bumps attached to contacts on the die. The solder bumps allow the die to be directly attached to the interposer 1204. The integrated circuit component 1220 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1220 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1220 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204.

In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art. In embodiments where the interposer is a non-printed circuit board The integrated circuit device assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit device assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
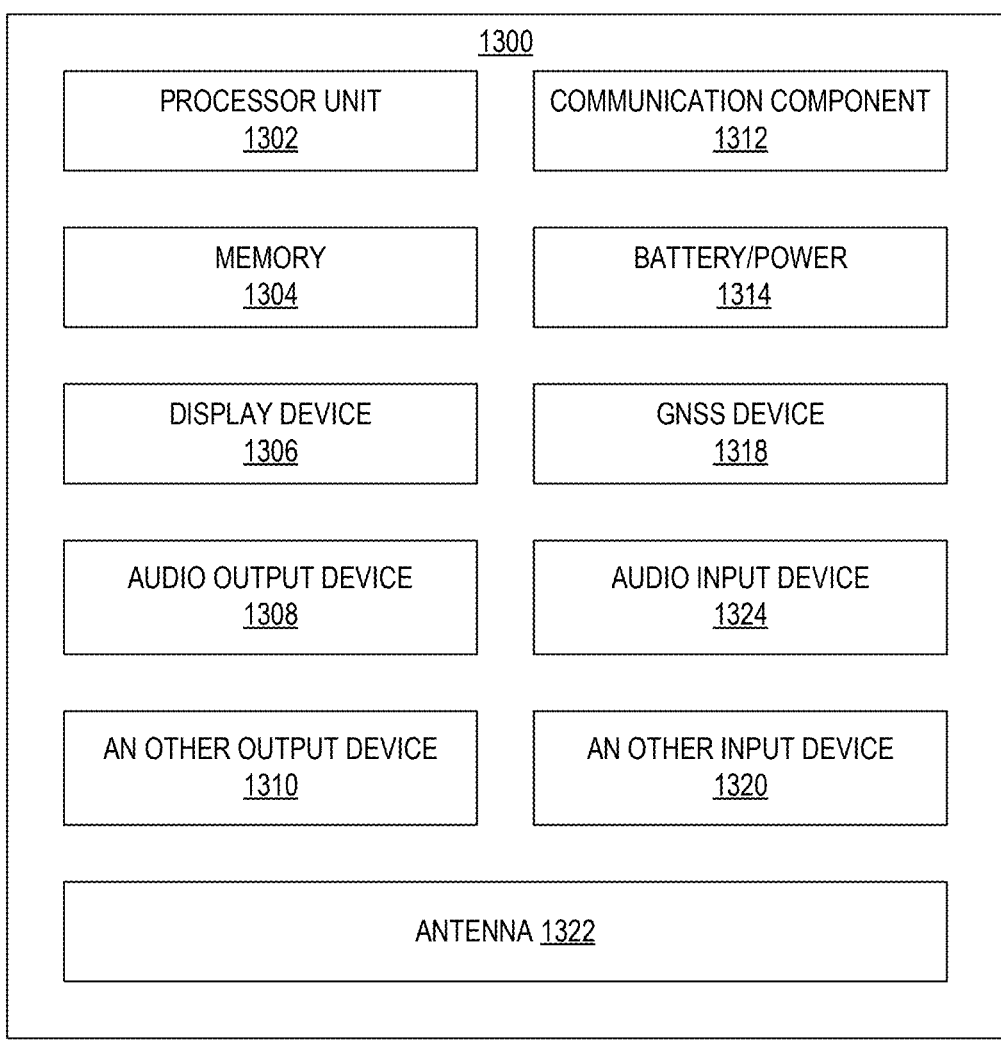
FIG. 13 is a block diagram of an example electrical device, in accordance with any of the embodiments disclosed herein.

FIG. 13 is a block diagram of an example electrical device 1300 that may include one or more of the dies 304 disclosed herein. For example, any suitable ones of the components of the electrical device 1300 may include one or more of the integrated circuit device assemblies 1200, integrated circuit components 1220, integrated circuit devices 1000, or integrated circuit dies 902 disclosed. A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards mainboards, or system boards. In some embodiments, one or more of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1300 can comprise one or more processor units 1302 that are heterogeneous or asymmetric to another processor unit 1302 in the electrical device 1300. There can be a variety of differences between the processing units 1302 in a system in terms of a spectrum of metrics of merit including architectural, microarchitectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as micro- phones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include an other output device 1310 (or corresponding interface circuitry, as dis- cussed above). Examples of the other output device 1310 may include an audio codec, a video codec, a printer, a wired or wireless transmitter for providing information to other devices, or an additional storage device.

The electrical device 1300 may include an other input device 1320 (or corresponding interface circuitry, as dis- cussed above). Examples of the other input device 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sen- sor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a por- table gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data.

In some embodiments, the electrical device 1300 may com- prise multiple discrete physical components. Given the range of devices that the electrical device 1300 can be manifested as in various embodiments, in some embodi- ments, the electrical device 1300 can be referred to as a computing device or a computing system.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

EXAMPLES

Example 1 includes a die comprising an impedance matching network comprising an input; an output; a capaci- tor connected across the input and the output; and an inductor connected across the output and a ground, wherein the capacitor and the inductor are superconductors; and a plurality of transistors, wherein individual transistors of the plurality of transistors comprise an input connected to the output of the impedance matching network and an output connected to an output pad.

Example 2 includes the subject matter of Example 1, and further including a plurality of impedance matching net- works, the plurality of impedance matching networks com- prising the impedance matching network; and frequency multiplexing circuitry to split a multi-frequency signal from an input of the die to a plurality of signals, wherein indi- vidual signals of the plurality of signals has a different frequency band from other signals in the plurality of signals, wherein individual signals of the plurality of signals are provided to an input of one of the plurality of impedance matching networks.

Example 3 includes the subject matter of any of Examples 1 and 2, and further including, for individual impedance matching networks of the plurality of impedance matching networks, an additional plurality of transistors, wherein individual transistors of individual additional pluralities of transistors of the additional pluralities of transistors com- prise an input connected to the output of the corresponding impedance matching network and an output connected to an output pad.

Example 4 includes the subject matter of any of Examples 1-3, and wherein the plurality of signals comprise at least 10 signals, wherein individual additional pluralities of transis- tors of the additional pluralities of transistors comprises at least 10 transistors.

Example 5 includes a system comprising the die of Example 4, further comprising at least 100 qubits, wherein the die can address any of the 100 qubits through a single input channel.

Example 6 includes the subject matter of Example 5, and wherein the frequency multiplexing circuitry comprises a plurality of couplers, wherein individual couplers of the plurality of couplers has a bandwidth corresponding to the frequency band of the corresponding signal.

Example 7 includes the subject matter of any of Examples 5 and 6, and wherein the capacitor and the inductor form at least part of a resonator with a Q factor of at least one thousand when at an operating temperature of the impedance matching network.

Example 8 includes the subject matter of any of Examples 5-7, and further including an amplifier to amplify a signal reflected off of the impedance matching network.

Example 9 includes the subject matter of any of Examples 5-8, and wherein the capacitor and the inductor comprise titanium and nitrogen.

Example 10 includes the subject matter of any of Examples 5-9, and wherein the capacitor and the inductor comprise niobium and nitrogen.

Example 11 includes the subject matter of any of Examples 5-10, and wherein the capacitor and the inductor comprise niobium.

Example 12 includes the subject matter of any of Examples 5-11, and wherein the capacitor and the inductor comprise aluminum.

Example 13 includes the subject matter of any of Examples 5-12, and wherein the die is at a temperature below 4 Kelvin.

Example 14 includes the subject matter of any of Examples 5-13, and wherein the impedance matching network further comprises a varactor across the input and ground.

Example 15 includes a system comprising the die of Example 1, further comprising a stimulus source to send signals to the impedance matching network; one or more qubits, wherein individual qubits of the one or more qubits is coupled to an output pad connected to one of the plurality of transistors; and a receiver to receive signals reflected from the impedance matching network.

Example 16 includes the subject matter of Example 15, and further including control circuitry to control the plurality of transistors to select a qubit of the one or more qubits; control the stimulus source to send a signal to the impedance matching network; receive a signal from the receiver in response to the signal sent to the impedance matching network; and determine a state of the selected qubit based on the signal received from the receiver.

Example 17 includes the subject matter of any of Examples 15 and 16, and further including one or more single-electron transistors, wherein individual single-electron transistors of the one or more single-electron transistors has a resistance that depends on a state of a corresponding qubit of the one or more qubits, wherein individual single-electron transistors of the one or more single-electron transistors is connected to an output pad connected to one of the plurality of transistors.

Example 18 includes a method comprising fabricating one or more semiconductor components on a semiconductor layer of a wafer, the one or more semiconductor components to select a qubit of a plurality of qubits to be connected to a die of the wafer; applying a dielectric layer on the wafer; and fabricating one or more superconductor components on the dielectric layer, wherein the one or more superconductor components form part of an impedance matching network on the wafer to transform an impedance of an input signal to the die to an impedance of an output signal of the die connected to a qubit of the plurality of qubits.

Example 19 includes the subject matter of Example 18, and further including forming one or more vias through the dielectric layer, the one or more vias connecting the one or more semiconductor components to the one or more superconductor components.

Example 20 includes the subject matter of any of Examples 18 and 19, and wherein fabricating the one or more superconductor components comprises fabricating at least part of a resonator with a Q-factor of at least 1,000.

Example 21 includes a system comprising a plurality of qubits; and a die comprising one or more semiconductor components to select a qubit of the plurality of qubits; and an impedance matching network comprising one or more superconductor components to transform an impedance of an input signal to the die to an impedance of an output signal of the die connected to a qubit of the plurality of qubits.

Example 22 includes the subject matter of Example 21, and further including a plurality of impedance matching networks, the plurality of impedance matching networks comprising the impedance matching network; and frequency multiplexing circuitry to split a multi-frequency signal from an input of the die to a plurality of signals, wherein individual signals of the plurality of signals has a different frequency band from other signals in the plurality of signals, wherein individual signals of the plurality of signals is provided to an input of one of the plurality of impedance matching networks.

Example 23 includes the subject matter of any of Examples 21 and 22, and further including, for individual impedance matching networks of the plurality of impedance matching networks, a plurality of transistors, wherein individual transistors of individual pluralities of transistors of the pluralities of transistors comprise an input connected to an output of the corresponding impedance matching network and an output connected to an output pad.

Example 24 includes the subject matter of any of Examples 21-23, and wherein the plurality of signals comprise at least 10 signals, wherein individual pluralities of transistors of the pluralities of transistors comprises at least 10 transistors.

Example 25 includes the subject matter of any of Examples 21-24, and further including at least 100 qubits, wherein the die can address any of the 100 qubits through a single input channel.

Example 26 includes the subject matter of any of Examples 21-25, and wherein the frequency multiplexing circuitry comprises a plurality of couplers, wherein individual couplers of the plurality of couplers has a bandwidth corresponding to the frequency band of the corresponding signal.

Example 27 includes the subject matter of any of Examples 21-26, and wherein the one or more superconductor components form at least part of a resonator with a Q factor of at least one thousand when at an operating temperature of the impedance matching network.

Example 28 includes the subject matter of any of Examples 21-27, and wherein the die further comprises an amplifier to amplify a signal reflected off of the impedance matching network.

Example 29 includes the subject matter of any of Examples 21-28, and wherein the one or more superconductor components comprise titanium and nitrogen.

Example 30 includes the subject matter of any of Examples 21-29, and wherein the one or more superconductor components comprise niobium and nitrogen.

Example 31 includes the subject matter of any of Examples 21-30, and wherein the one or more superconductor components comprise niobium.

Example 32 includes the subject matter of any of Examples 21-31, and wherein the one or more superconductor components comprise aluminum.

Example 33 includes the subject matter of any of Examples 21-32, and wherein the die is at a temperature below 4 Kelvin.

Example 34 includes the subject matter of any of Examples 21-33, and wherein the impedance matching network further comprises a varactor across an input and a ground.

Example 35 includes the subject matter of any of Examples 21-34, and further including a stimulus source to send signals to the impedance matching network; one or more qubits, wherein individual qubits of the one or more qubits is coupled to an output pad connected to one of a plurality of transistors; and a receiver to receive signals reflected from the impedance matching network.

Example 36 includes the subject matter of any of Examples 21-35, and further including control circuitry to control the plurality of transistors to select a qubit of the one or more qubits; control the stimulus source to send a signal to the impedance matching network; receive a signal from the receiver in response to the signal sent to the impedance matching network; and determine a state of the selected qubit based on the signal received from the receiver.

Example 37 includes the subject matter of any of Examples 21-36, and further including one or more single-electron transistors, wherein individual single-electron transistors of the one or more single-electron transistors has a resistance that depends on a state of a corresponding qubit of the one or more qubits, wherein individual single-electron transistors of the one or more single-electron transistors is connected to an output pad connected to one of the plurality of transistors.

The invention claimed is:

1. A die comprising:
an impedance matching network comprising:
    an input;
    an output;
    a capacitor connected across the input and the output; and
    an inductor connected across the output and a ground, wherein the capacitor and the inductor are superconductors; and
a plurality of transistors, wherein individual transistors of the plurality of transistors comprise an input connected to the output of the impedance matching network and an output connected to an output pad.

2. The die of claim 1, further comprising:
a plurality of impedance matching networks, the plurality of impedance matching networks comprising the impedance matching network; and
frequency multiplexing circuitry to split a multi-frequency signal from an input of the die to a plurality of signals, wherein individual signals of the plurality of signals has a different frequency band from other signals in the plurality of signals, wherein individual signals of the plurality of signals are provided to an input of one of the plurality of impedance matching networks.

3. The die of claim 2, further comprising, for individual impedance matching networks of the plurality of impedance matching networks, an additional plurality of transistors, wherein individual transistors of individual additional pluralities of transistors of the additional pluralities of transistors comprise an input connected to the output of the corresponding impedance matching network and an output connected to an output pad.

4. The die of claim 3, wherein the plurality of signals comprise at least 10 signals, wherein individual additional pluralities of transistors of the additional pluralities of transistors comprises at least 10 transistors.

5. A system comprising the die of claim 4, further comprising at least 100 qubits, wherein the die can address any of the 100 qubits through a single input channel.

6. The die of claim 2, wherein the frequency multiplexing circuitry comprises a plurality of couplers, wherein individual couplers of the plurality of couplers has a bandwidth corresponding to the frequency band of the corresponding signal.

7. The die of claim 1, wherein the capacitor and the inductor form at least part of a resonator with a Q factor of at least one thousand when at an operating temperature of the impedance matching network.

8. The die of claim 1, further comprising an amplifier to amplify a signal reflected off of the impedance matching network.

9. The die of claim 1, wherein the capacitor and the inductor comprise titanium and nitrogen.

10. The die of claim 1, wherein the capacitor and the inductor comprise niobium and nitrogen.

11. The die of claim 1, wherein the die is at a temperature below 4 Kelvin.

12. The die of claim 1, wherein the impedance matching network further comprises a varactor across the input and ground.

13. A system comprising the die of claim 1, further comprising:
a stimulus source to send signals to the impedance matching network;
one or more qubits, wherein individual qubits of the one or more qubits is coupled to an output pad connected to one of the plurality of transistors; and
a receiver to receive signals reflected from the impedance matching network.

14. The system of claim 13, further comprising control circuitry to:
control the plurality of transistors to select a qubit of the one or more qubits;
control the stimulus source to send a signal to the impedance matching network;
receive a signal from the receiver in response to the signal sent to the impedance matching network; and
determine a state of the selected qubit based on the signal received from the receiver.

15. The system of claim 13, further comprising one or more single-electron transistors, wherein individual single-electron transistors of the one or more single-electron transistors has a resistance that depends on a state of a corresponding qubit of the one or more qubits, wherein individual single-electron transistors of the one or more single-electron transistors is connected to an output pad connected to one of the plurality of transistors.

16. A system comprising the die of claim 2, further comprising:
a stimulus source to send signals to the impedance matching network;
one or more qubits, wherein individual qubits of the one or more qubits is coupled to an output pad connected to one of the plurality of transistors; and
a receiver to receive signals reflected from the impedance matching network.

17. The system of claim 16, further comprising control circuitry to:
control the plurality of transistors to select a qubit of the one or more qubits;
control the stimulus source to send a signal to the impedance matching network;

receive a signal from the receiver in response to the signal sent to the impedance matching network; and determine a state of the selected qubit based on the signal received from the receiver.

18. The system of claim 16, further comprising one or more single-electron transistors, wherein individual single-electron transistors of the one or more single-electron transistors has a resistance that depends on a state of a corresponding qubit of the one or more qubits, wherein individual single-electron transistors of the one or more single-electron transistors is connected to an output pad connected to one of the plurality of transistors.

* * * * *